United States Patent
Ishikawa et al.

(10) Patent No.: US 7,284,686 B2
(45) Date of Patent: Oct. 23, 2007

(54) MOUNTING METHOD OF BUMP-EQUIPPED ELECTRONIC COMPONENT AND MOUNTING STRUCTURE OF THE SAME

(75) Inventors: Takstoshi Ishikawa, Fukuoka (JP); Makoto Okazaki, Saga (JP); Tadahiko Sakai, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 266 days.

(21) Appl. No.: 11/009,451

(22) Filed: Dec. 10, 2004

(65) Prior Publication Data
US 2005/0127141 A1    Jun. 16, 2005

(30) Foreign Application Priority Data
Dec. 12, 2003    (JP) .............................. 2003-414476

(51) Int. Cl.
B23K 1/06    (2006.01)
B23K 20/10    (2006.01)
(52) U.S. Cl. ..................... 228/110.1; 228/1.1
(58) Field of Classification Search ............. 228/110.1, 228/1.1
See application file for complete search history.

(56) References Cited
U.S. PATENT DOCUMENTS

| | | | |
|---|---|---|---|
| 5,192,015 A * | 3/1993 | Ingle et al. ............... | 228/111 |
| 6,543,668 B1 * | 4/2003 | Fujii et al. ............... | 228/103 |
| 6,653,171 B2 * | 11/2003 | Ikegami .................. | 438/120 |
| 6,798,072 B2 * | 9/2004 | Kajiwara et al. .......... | 257/778 |
| 6,884,835 B2 * | 4/2005 | Ajbani et al. ............ | 524/447 |
| 2002/0056906 A1 * | 5/2002 | Kajiwara et al. .......... | 257/697 |

FOREIGN PATENT DOCUMENTS

| | | |
|---|---|---|
| JP | 10-335373 | 12/1998 |
| JP | 2001-298146 | 10/2001 |

* cited by examiner

*Primary Examiner*—Kevin P. Kerns
(74) *Attorney, Agent, or Firm*—Pearne & Gordon LLP

(57) ABSTRACT

In a mounting method for mounting a bump-equipped electronic component 5 with a plurality of metallic bumps 6 on a substrate 2 with a plurality of electrodes 3, during the process of connecting the metallic bumps 6 to the electrodes 3 by aligning the metallic bumps with the electrodes 3 with thermosetting resin 4 intervening between the electronic component 5 and substrate 2 and by pressing the electronic component 5 to the substrate 2 while exerting ultrasonic oscillation, heat and applied pressure on the electronic component 5, all of the metallic bumps 6 are brought into contact with the electrodes so that they are electrically connected to each other, and when some of the metallic bumps are metallic-bonded to the electrodes, ultrasonic oscillation is stopped. Thus, it is possible to prevent occurrence of damage owing to the excessive exertion of ultrasonic oscillation on the metallic bumps which have precedently started their metallic-bonding.

5 Claims, 3 Drawing Sheets

MOUNTING METHOD OF BUMP-EQUIPPED ELECTRONIC COMPONENT AND MOUNTING STRUCTURE OF THE SAME

BACKGROUND OF THE INVENTION

1. Field of the Invention

This invention relates to a mounting method of a bump-equipped electronic component for mounting a bump-equipped electronic component with a plurality of metallic bumps on a substrate and a mounting structure of the bump-equipped electronic component with a plurality of metallic bumps.

2. Description of the Related Art

As a technique for mounting, on a substrate, a bump-equipped electronic component such as a flip chip which is a semiconductor device equipped with metallic bumps which are electrodes for connection, ultrasonic bonding has been adopted (for example, JP-A-10-335373 and JP-A-2001-298146). In this mounting technique, by pressing the bump-equipped electronic component onto the substrate with ultrasonic oscillation, heat and applied pressure being exerted on the bump-equipped electronic component, the metallic bumps are metallic-bonded to the electrodes on the substrate through ultrasonic bonding so that the metallic bumps are electrically connected to the electrodes Meanwhile, there are changes in the size of the metallic bumps formed on the bump-equipped electronic component. In the above ultrasonic bonding, the bumps are metallic-bonded to the electrodes in order from the bump having a larger size brought in contact with the corresponding electrode. During the bonding process, the metallic bumps are slightly crushed by pressure so that all the metallic bumps are metallic-bonded to the corresponding electrodes, thus completing the ultrasonic bonding.

However, in the above ultrasonic bonding for the bump-equipped electronic component, the degree of progress of the ultrasonic bonding is different for each metallic bump because of a difference in bump size. Therefore, the metallic bump for which the metallic bonding has been precendently started is continuously subjected to ultrasonic oscillation with the lower end having already been metallic-bonded to the electrode. The metallic bump excessively subjected to such ultrasonic oscillation suffers from an excessive stress due to oscillation displacement at the base of the bump. This leads to a problem that in the state where the ultrasonic bonding has been completed, a damage such as a crack is generated at the base of the bump.

SUMMARY OF THE INVENTION

In view of the above circumstance, an object of this invention is to provide a mounting method of a bump-equipped electronic component which can prevent occurrence of damage during an ultrasonic bonding process and a mounting structure of the bump-equipped electronic component.

The bump-equipped electronic component mounting method according to this invention is a bump-equipped electronic component mounting method for mounting a bump-equipped electronic component with a plurality of metallic bumps on a substrate with a plurality of electrodes, comprising the steps of:

aligning the plurality of metallic bumps with the plurality of electrodes with thermosetting resin intervening between the electronic component and substrate;

pressing the electronic component to the substrate while exerting ultrasonic oscillation, heat and applied pressure onto the bump-equipped electronic component, and bring all of the plurality of metallic bumps into contact with the plurality of electrodes so that they are electrically connected to each other, and also when some of the plurality of metallic bumps are metallic-bonded to the plurality of electrodes, substantially stopping ultrasonic oscillation.

The mounting structure of a bump-equipped electronic component according to this invention is a mounting structure of a bump-equipped electronic component in which by pressing the bump-equipped electronic component with the plurality of metallic bumps onto the substrate with the plurality of electrodes while exerting the ultrasonic oscillation, heat and applied pressure on the electronic component, the metallic bumps are brought into contact with the plurality of electrodes so that they are electrically connected to each other, and the substrate and the electronic component are bonded to each other through thermosetting resin, characterized in that some of the plurality of metallic bumps are connected to the electrodes through metallic bonding whereas the remaining metallic bumps are electrically connected to the plurality of electrodes through contact between therebetween.

In accordance with this invention, during the process of pressing the bump-equipped electronic component onto the substrate while exerting ultrasonic oscillation, heat and applied pressure on the bump-equipped electronic component, all of the metallic bumps are brought into contact with the electrodes so that they are electrically connected to each other, and when some of the metallic bumps are metallic-bonded to the electrodes, ultrasonic oscillation is substantially stopped. Thus, it is possible to prevent occurrence of damage owing to the excessive exertion of ultrasonic oscillation on the metallic bumps which have precedently started their metallic-bonding.

DESCRIPTION OF THE PREFERRED EMBODIMENTS

Figure 1:
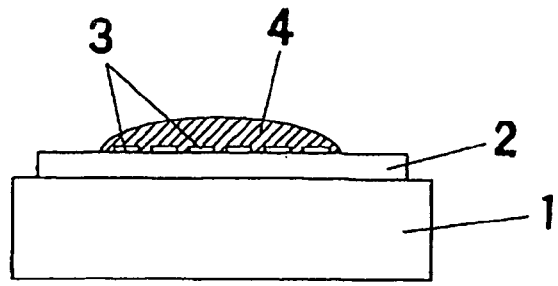
FIG. 1 is a flowchart for explaining the steps of an electronic component mounting method according to an embodiment of this invention.
Figure 1:
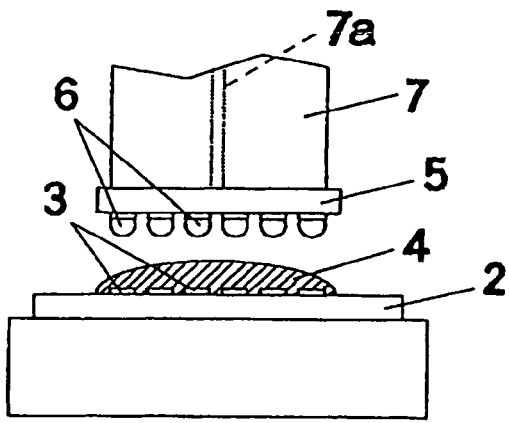
Figure 1:
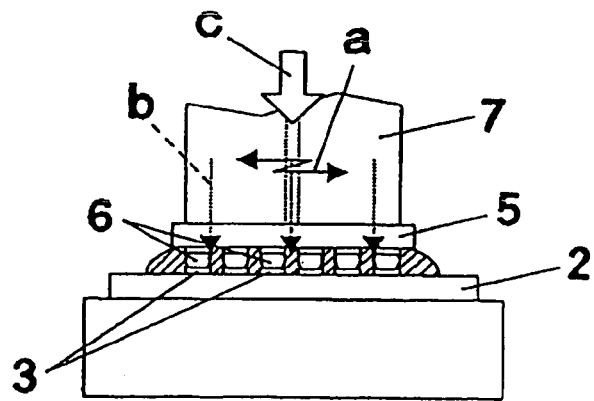
Figure 1:
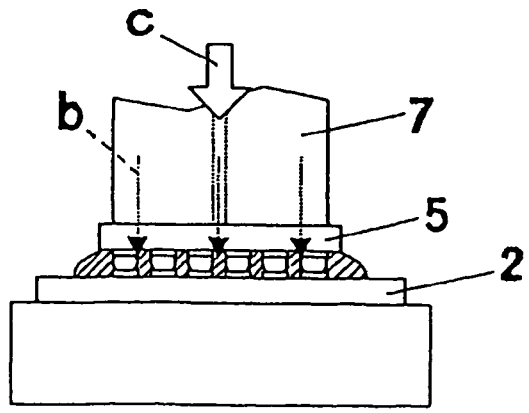
Figure 2:
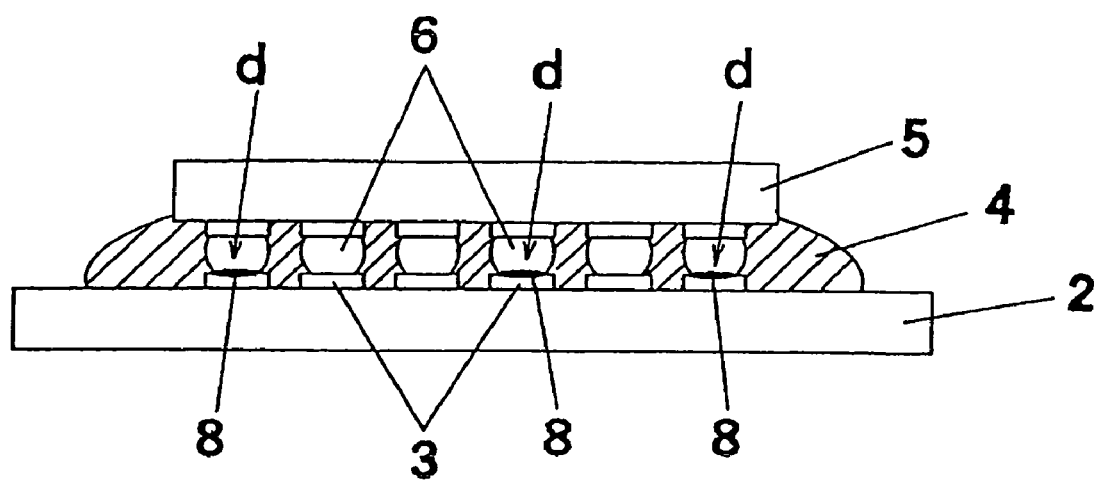
FIG. 2 is a sectional view of the electronic component mounting structure according to an embodiment of this invention.
Figure 3:
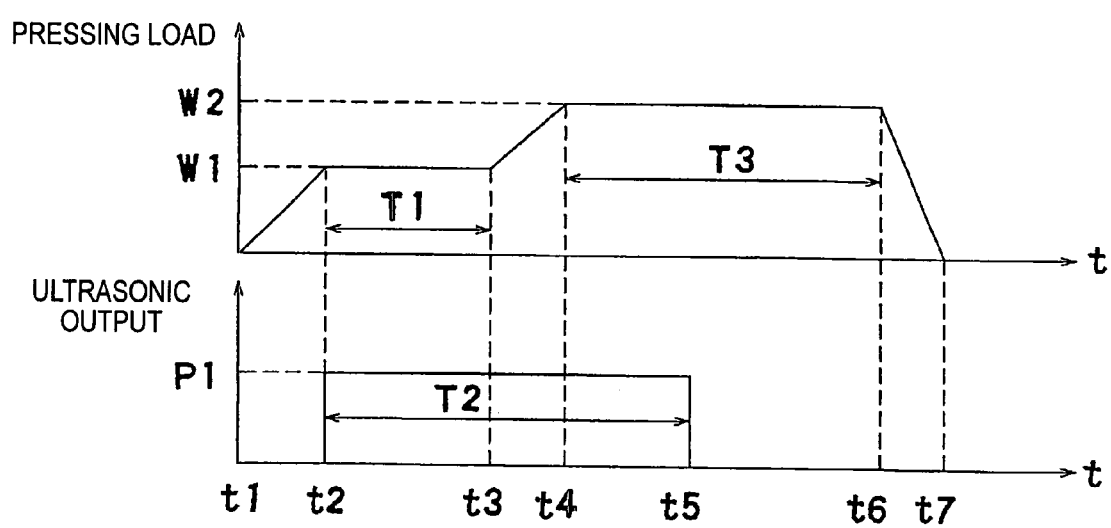
FIG. 3 is a timing chart of a pressing load and ultrasonic output in the electronic component mounting method according to an embodiment of this invention.

Now referring to the drawings, an explanation will be given of an embodiment of this invention. FIG. 1 is a flowchart for explaining the steps of an electronic component mounting method according to an embodiment of this invention. FIG. 2 is a sectional view of the electronic component mounting structure according to an embodiment of this invention. FIG. 3 is a timing chart of a pressing load and ultrasonic output in the electronic component mounting method according to an embodiment of this invention.

Referring to FIG. 1, an explanation will be given of the electronic component mounting method. This electronic component mounting method intends to mount a bump-equipped electronic component with a plurality of metallic bump on the substrate with a plurality of electrodes. Now it is assumed that the metallic bumps are formed of gold bumps, and the electrodes are formed of gold layers with their surface plated with gold.

In FIG. 1(a), a substrate 2 with electrodes 3 formed on its upper surface is held on a substrate holding portion 1. On the upper surface of the substrate 2, a thermosetting resin 4 such as epoxy resin is applied by the application using a dispenser. The resin 4 may be applied in such a manner that a resin sheet which is the resin 4 formed in a sheet-like shape is bonded on the surface of the substrate 2.

Next, as seen from FIG. 1(b), a tool 7 for ultrasonic crimping is caused to hold a bump-equipped electronic component 5 (hereinafter simply referred to as an electronic component 5) with metallic bumps serving as connecting electrodes formed on the lower surface. Namely, the electronic component 5 is sucking-held in such a manner that it is vacuum-sucked through a sucking slot 7a with the holding surface of the tool 7 being kept in contact with the rear surface (which is a surface opposite the surface where the bumps are formed).

The crimping device (not shown) with the tool 7 mounted thereon is provided with an oscillation applying device, a heating device and a pressing mechanism. With the tool 7 being kept in contact with the rear surface of the electronic component 5, the crimping device can exert ultrasonic oscillation, heat and applied pressure on the electronic component 5 by means of the tool 7. The oscillation applying device can optionally control The start/stop and outputting of the ultrasonic oscillation. The heating device also can optionally set a heating temperature. The pressing mechanism also can optionally set a pressing load.

The tool 7 holding the electronic component 5 is moved onto the substrate 2 with the resin 4 previously applied on the electrodes 3. With the resin intervening between the electronic component 5 and the substrate 2, the plurality of metallic bumps 6 are aligned with the plurality of electrodes 3. Next, as seen from FIG. 1(c), the tool 7 as well as the electronic component 5 is lowered to cause the lower surface of the metallic bumps 6 to land on the surface of the electrodes 3, thereby bonding the metallic bumps 6 onto the electrodes 3 through the ultrasonic oscillation (arrow a), heat (arrow b) and applied pressure (arrow c.)

Referring to the timing chart of FIG. 3, this bonding process will be explained. FIG. 3 shows changes in the pressing load and ultrasonic output in a time sequence after timing t1 when the landing of the metallic bumps 6 on the electrodes 3 is started. Additionally, over the timings shown in FIG. 3, the heating device is in an ON state so that the electronic component 5 is continuously heated by the tool 7. The resin 4 intervening between the substrate 2 and the electronic component 5 is heated from timing t1 and its thermosetting is started.

The metallic bumps 6 has slightly different sizes. At timing t1, of the plurality of metallic bumps 6, some of the metallic bumps 6 having a relatively large size first land on the surface of the electrodes 3. After timing t1, by pressing down the electronic component 5 using the tool 7, as the pressing load increases, the metallic bumps 6 first brought into contact with the electrodes 3 are slightly crushed by this increasing load so that the bumps still not brought into contact will be successively brought into contact with the electrodes 3.

At timing t2, if the pressing load reaches a first prescribed load W1 enough for about half of the metallic bumps 6 to be ultrasonic-bonded, the oscillation applying device is turned ON to start the application of the ultrasonic oscillation at a prescribed output P1. In the interval from timing t2 to timing t3 during which the first prescribed time period T1 elapses, the first prescribed load W1 is kept.

For this period, the heat, pressing load and ultrasonic oscillation are exerted on the contact plane between the metallic bumps 6 and the electrodes 3. Thus, gold at the lower ends of the metallic bumps 6 which have been precedently brought into contact with the electrodes 3 is metallic-bonded to the gold layer on the surface of the electrodes 3. By continuing the application of the oscillation to timing t5 when an ultrasonic wave applying time period T2 ends, the metallic bumps 6 are successively metallic-bonded to the surface of the electrodes 3 in the order of their contact with electrodes 3. Incidentally, the metallic-bonding in this invention includes the bonding between different metals in addition to the boding between the same kind of metals such as gold and gold.

At timing t3, the pressing load is increased from the first prescribed pressing load W1. In the interval from timing t4 when the pressing load reaches a second prescribed load W2 enough for all the metallic bumps 6 to be brought into contact with the electrodes 3 to timing t6 when a second pressing time period T3 ends, the second prescribed load W2 is kept. Thus, the degree of plastic deformation due to the load of the metallic bumps 6 increases so that all the metallic bumps 6 are brought into contact with the electrodes 3. Thereafter, by lifting the tool 7, the pressing load becomes zero at timing t7, thus completing the bonding process.

Now, as seen from FIG. 3, the ultrasonic oscillation applying time period T2 is set so that timing 5 comes earlier than timing t6 to satisfy the following condition. Specifically, the ultrasonic oscillation applying time T2 is set so that the application of the ultrasonic oscillation is stopped before gold at the lower surface of all the metallic bumps 6 is metallic-bonded to the gold layer on the surface of the electrodes, in other words, so that the application of the ultrasonic oscillation is stopped in a state where only some of all the metallic bumps 6 in contact with the electrodes 6 have been metallic-bonded to the electrodes 3 whereas the other remaining metallic bumps 6 are only in contact with but not metallic-bonded to the electrodes 6. This ultrasonic oscillation applying time period T2 is individually set according to an objective substrate 2 and the kind of the electronic component 5. The time period T2 is empirically determined on the basis of the result of the operation of changing the conditions such as the above first load W1, second load W2 and prescribed output P1 of the ultrasonic oscillation into various values.

In the latter half of the ultrasonic oscillation applying time period T2, gelling of the resin 4 due to thermosetting has proceeded so that a part of the energy of the ultrasonic oscillation conducted to the metallic bumps 6 of the electronic component 5 through the tool 7 is absorbed by the resin 4 around the metallic bumps 6. Thus, it is possible to prevent the electronic component 5 from being damaged owing to the excessive exertion of the ultrasonic oscillation on the environment of the metallic bumps 6.

In the time interval from timing t5 to timing t6, as seen from FIG. 1(d), since the application of the heat and load to the electronic component 5 by the tool 7 is continued, the thermosetting of the resin 4 proceeds so that the resin 4 contracts. This increases the contact plane pressure between the metallic bumps 6 still not metallic-bonded and the electrodes 3, thereby improving the adhesiveness therebetween.

In short, the process for bonding the metallic bumps 6 to the electrodes 3 in the electronic component mounting method described above includes the steps of pressing the electronic component 5 onto the substrate 2 while exerting the ultrasonic oscillation, heat and applied pressure on the electronic component 5, and of electrically connecting the electronic component 5 to the substrate 2 with all the metallic bumps 6 being into contact with the electrodes 3 and also when some of the metallic bumps are metallic-bonded substantially stopping the application of the ultrasonic oscillation.

Further, also when the ultrasonic oscillation is substantially stopped, the heat and applied pressure are continuously exerted on the electronic component 5. Now, the substantial stopping of the ultrasonic oscillation means stopping applying the ultrasonic oscillation at an output level where the metallic bumps 6 may be damaged. Therefore, after timing t5, the case where the ultrasonic oscillation continues at the output level not damaging the electronic component applies to the substantial stopping of the ultrasonic oscillation.

Thus, there does not occur a situation where the ultrasonic oscillation is excessively applied, during the time period exceeding an appropriate ultrasonic bonding period, to the metallic bumps 6 which have been precedently brought into contact with the electrodes during the bonding process to start the ultrasonic bonding early. As a result, occurrence of damage owing to excessive application of the ultrasonic oscillation can be effectively prevented.

Further, in this electronic component mounting method, since some of the plurality of metallic bumps 6 are metallic-bonded, even when the thermosetting of the resin 4 is not sufficient in the mounting process, the electronic component 5 is fixed to the substrate 2 through these metallic bumps 6 metallic-bonded. Accordingly, the tact time for mounting is prevented from being delayed owing to lengthening the pressing time period by the tool 7 for the purpose of sufficiently setting the resin 4, thereby realizing an effective mounting operation.

FIG. 2 shows a mounting structure obtained by the electronic component described above, i.e. a section of the mounting structure of the bump-equipped electronic component in which by pressing the electronic component 5 with the plurality of metallic bumps 6 onto the substrate 2 with the plurality of electrodes 3 while exerting the ultrasonic oscillation, heat and applied pressure on the electronic component, the metallic bumps 6 are brought into contact with the plurality of electrodes 3 so that they are electrically connected to each other and also the substrate 2 and electronic component 5 are bonded to each other by the thermosetting resin 4.

In the above mounting structure, the metallic bumps 6 denoted by arrow d are connected to the corresponding electrodes 3 through the metallic bonding layers 8 which are formed as a result that gold at the lower end of each metallic bump 6 is metallic-bonded to the gold layer on the surface of each electrode 3. The metallic bumps 6 other than these metallic bumps 6 thus metallic-bonded are connected to the corresponding electrodes 3 in such a manner that their lower end is kept in contact with the surface of each electrode 3. Namely, some of the plurality of metallic bumps 6 are connected to the electrodes 3 through metallic bonding whereas the remaining metallic bumps are electrically connected to the electrodes through contact between therebetween.

In the mounting structure of such a bump-equipped electronic component, the electronic component 5 is fixed to the substrate 2 through the resin 4 thermally set. In this state, since some of the metallic bumps 6 are metallic-bonded to the electrodes, even when the electronic component 2 comes off from the resin 4 because of the heating cycle in the using state after mounting, disconnection between the metallic bumps 6 and the electrodes 3 is difficult to occur. Thus, the mounting structure with high reliability can be realized.

The mounting method of the bump-equipped electronic component and the mounting structure of the bump-equipped electronic component according to this invention has an effect that they can prevent occurrence of damage owing to the excessive exertion of ultrasonic oscillation on the metallic bumps which have precedently started their metallic-bonding, and are useful in that the electronic component equipped with a large number of metallic bumps can be mounted on the substrate.

What is claimed is:

1. A bump-equipped electronic component mounting method for mounting a bump-equipped electronic component with a plurality of metallic bumps on a substrate with a plurality of electrodes, comprising the steps of:

aligning the plurality of metallic bumps with the plurality of electrodes with thermosetting resin intervening between the electronic component and substrate;

pressing the electronic component onto the substrate while exerting ultrasonic oscillation, heat and applied pressure on said bump-equipped electronic component, and bringing all of the plurality of metallic bumps into contact with the electrodes so that they are electrically connected to each other, and also when some of the plurality of metallic bumps are metallic-bonded to the plurality of electrodes, substantially stopping ultrasonic oscillation such that the ultrasonic oscillation is stopped in a state where only some of all the metallic bumps in contact with the electrodes have been metallic-bonded to the electrodes and whereas the other remaining metallic bumps are only in contact with but not metallic bonded to the electrodes.

2. The bump-equipped electronic component mounting method according to claim 1, wherein the heat and applied pressure is continuously exerted on the bump-equipped electronic component even after the ultrasonic oscillation has been substantially stopped.

3. The bump-equipped electronic component mounting method according to claim 1, wherein the ultrasonic oscillation, heat and applied pressure are exerted on the bump-equipped electronic component through a tool brought into contact with the bump-equipped electronic component.

4. The bump-equipped electronic component mounting method according to claim 1, wherein the plurality of metallic bumps are gold bumps.

5. The bump-equipped electronic component mounting method according to claim 1, wherein after the resin has been supplied onto the plurality of electrodes of the substrate, the plurality of metallic bumps are aligned with the plurality of electrodes covered with the resin.

* * * * *